(12) United States Patent
Jagueneau et al.

(10) Patent No.: US 7,534,692 B2
(45) Date of Patent: May 19, 2009

(54) PROCESS FOR PRODUCING AN INTEGRATED CIRCUIT COMPRISING A CAPACITOR

(75) Inventors: Thierry Jagueneau, Grenoble (FR); Jean-Christophe Giraudin, Bernin (FR); Christine Rossato, Chambery (FR)

(73) Assignee: STMicroelectronics, Montrouge (FR)

( * ) Notice: Subject to any disclaimer, the term of this patent is extended or adjusted under 35 U.S.C. 154(b) by 218 days.

(21) Appl. No.: 11/406,058

(22) Filed: Apr. 18, 2006

(65) Prior Publication Data

US 2006/0258111 A1    Nov. 16, 2006

(30) Foreign Application Priority Data

Apr. 19, 2005    (FR) .................................. 05 03893

(51) Int. Cl.
*H01L 21/20* (2006.01)
(52) U.S. Cl. ..................... 438/386; 438/381; 257/301; 257/E27.048
(58) Field of Classification Search ................. 438/379, 438/532, 386, 381; 257/301, E27.408
See application file for complete search history.

(56) References Cited

U.S. PATENT DOCUMENTS

| | | | |
|---|---|---|---|
| 5,604,696 A * | 2/1997 | Takaishi | ..................... 365/149 |
| 5,851,870 A | 12/1998 | Alugbin et al. | |
| 6,008,083 A | 12/1999 | Brabazon et al. | |
| 6,180,976 B1 | 1/2001 | Roy | |
| 6,249,014 B1 | 6/2001 | Bailey | |
| 6,251,740 B1 | 6/2001 | Johnson et al. | |
| 6,344,964 B1 | 2/2002 | Adler | |
| 6,399,399 B2 * | 6/2002 | Yamamoto | ..................... 438/3 |
| 6,441,419 B1 | 8/2002 | Johnson et al. | |
| 6,452,779 B1 | 9/2002 | Adler et al. | |
| 6,611,014 B1 | 8/2003 | Kanaya et al. | |
| 6,713,840 B1 | 3/2004 | Lee et al. | |
| 6,765,255 B2 * | 7/2004 | Jin et al. | ..................... 257/301 |
| 6,876,027 B2 | 4/2005 | Lien et al. | |
| 7,253,075 B2 | 8/2007 | Hieda | |
| 2002/0094656 A1 | 7/2002 | Armacost et al. | |
| 2002/0163029 A1 | 11/2002 | Dirnecker et al. | |
| 2003/0222301 A1 | 12/2003 | Igarashi | |
| 2004/0053427 A1 * | 3/2004 | Lee | ..................... 438/3 |
| 2004/0169211 A1 | 9/2004 | Zhuang et al. | |
| 2004/0201057 A1 | 10/2004 | Lien et al. | |
| 2005/0064718 A1 | 3/2005 | Yin et al. | |
| 2005/0116276 A1 | 6/2005 | Gau | |

OTHER PUBLICATIONS

Preliminary French Search Report, FR 05 03893, dated Dec. 7, 2005.

* cited by examiner

*Primary Examiner*—Asok K Sarkar
*Assistant Examiner*—Julia Slutsker
(74) *Attorney, Agent, or Firm*—Gardere Wynne Sewell LLP

(57) ABSTRACT

An integrated circuit is produced to include interconnection levels each incorporating a metallization level covered with an insulating material. The integrated circuit includes at least one capacitor possessing at least one part lying within a single interconnection level. The capacitor is produced before the interconnection level is produced. The covering of part of the capacitor with an insulating protective layer occurs before the metallization level of the interconnection level is produced.

10 Claims, 7 Drawing Sheets

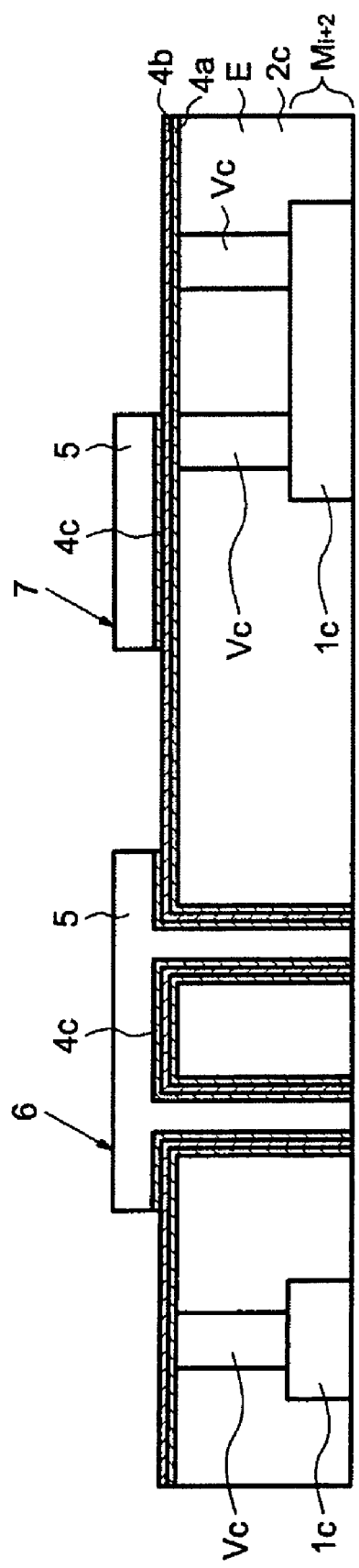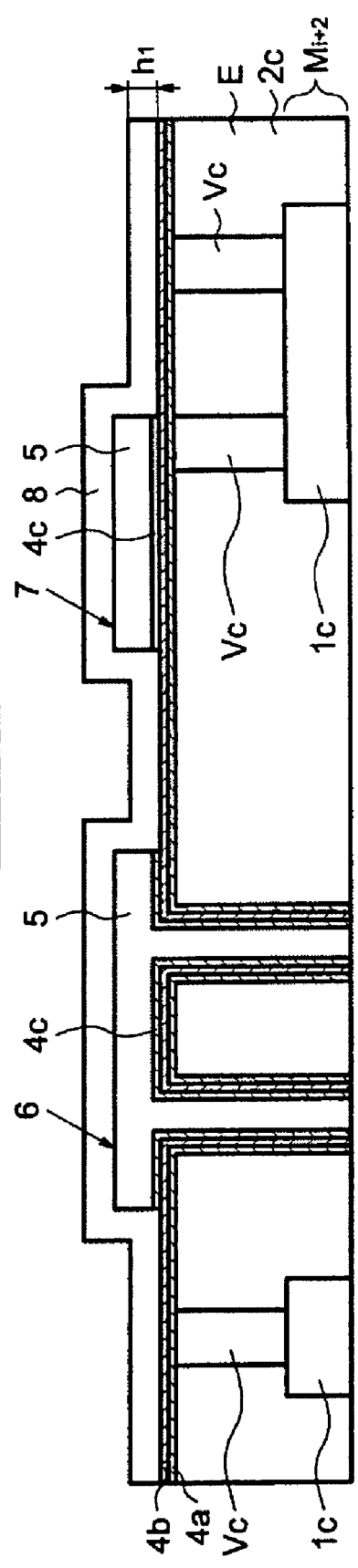

PROCESS FOR PRODUCING AN INTEGRATED CIRCUIT COMPRISING A CAPACITOR

PRIORITY CLAIM

The present application claims priority from French Application for Patent No. 05 03893 filed Apr. 19, 2005, the disclosure of which is hereby incorporated by reference.

BACKGROUND OF THE INVENTION

1. Technical Field of the Invention

The present invention relates to integrated circuits and more particularly to integrated circuits comprising at least one capacitor.

2. Description of Related Art

It is known to produce planar or three-dimensional capacitors using an aluminum technology (by reactive ion etching or RIE) or a copper technology (damascene method).

Capacitors are conventionally obtained from an MIM (metal-insulator-metal) capacitive multilayer in which the lower layer is a conducting material, such as for example, TiN, the insulator is a dielectric, for example having a high permittivity (or high-k dielectric), and the upper electrode is a conducting material, such as TiN. These capacitors are generally produced separately and then assembled in a complex circuit. The production of capacitors within even one integrated circuit still remains today a challenge, given that this production must be compatible with the existence of active components within this complex circuit.

Within an integrated circuit, the capacitor is generally produced before the interconnection level is produced. The production of the interconnection level comprises a metallization level, a metal etching step in order to obtain the interconnection lines and the deposition of an insulator, such as an intermetallic dielectric. Generally, during the metal etching step, the electrodes of the capacitor are damaged. More particularly, the electrodes may be partly or completely eroded by the overetching of the metal. When the lower electrode is offset, the overetching of the metal may completely erode it to the point of eliminating its offset part. It may also happen that two electrodes are brought into contact with each other via residues of underetched metal.

SUMMARY OF THE INVENTION

Embodiments of the present invention provide a solution to these problems, especially by depositing an insulating protective layer over the entire capacitor.

According to one aspect of the invention, what is proposed is a process for producing an integrated circuit, comprising the production of interconnection levels each incorporating a metallization level covered with an insulating material and the production of at least one capacitor possessing at least one part lying within a single interconnection level, wherein the capacitor is produced before said interconnection level is produced and said part of said capacitor is covered with an insulating protective layer before the metallization level of said interconnection level is produced.

According to one method of implementation, the production of said part of the capacitor includes the formation of a metal-insulator-metal capacitive multilayer, the deposition of a metal layer on the capacitive multilayer, the photoetching of the upper metal layers so as to form the upper electrode of the capacitor, then the deposition of the insulating protective layer followed by simultaneous photoetching of the insulating protective layer, the dielectric and the lower metal layer offset with respect to the upper electrode and covered by the dielectric and said insulating protective layer.

Preferably, the insulating protective layer consists of silicon oxide or silicon nitride.

More particularly, the insulating protective layer is at least 1000 Å.

According to a preferred method of implementation, the capacitor is a planar capacitor lying entirely within said interconnection level.

According to a preferred method of implementation, the capacitor is a three-dimensional capacitor possessing said offset part covered with the insulating protective layer and at least one capacitive trench lying within at least one interconnection level below that in which said offset part lies.

More particularly, the three-dimensional capacitor has at least two capacitive trenches lying within a dielectric. The process comprises producing a metal layer embedded in said dielectric, etching the dielectric, stopping on said metal layer so as to form said trenches, and depositing a layer of conductive material forming the lower electrode of the capacitor, at least on the sidewalls of said trenches and in contact with said metal layer.

According to another aspect of the invention, what is proposed is an integrated circuit comprising one capacitor coated with an insulating protective layer, said layer lying on a single interconnection level of the integrated circuit.

According to one embodiment, the insulating protective layer covers the upper electrode and the dielectric deposited on an offset part of the lower electrode of the capacitor.

Preferably, the insulating protective layer consists of silicon oxide or silicon nitride.

More particularly, the insulating protective layer is at least 1000 Å.

According to another embodiment, the capacitor is a planar capacitor lying within a single interconnection level.

According to another embodiment, the capacitor is a three-dimensional capacitor possessing an upper part covered by said protective layer and at least one capacitive trench.

More particularly, the three-dimensional capacitor lying within a dielectric includes a metal layer embedded in the said dielectric, at least two capacitive trenches, the bottoms of which bear on said metal layer, and a layer of conducting material forming the lower electrode of the capacitor, said layer of conducting material being located at least on the side walls of said trenches and in contact with said metal layer.

In accordance with another embodiment, a process for producing an integrated circuit comprises producing at least one lower interconnection level of the integrated circuit and producing a capacitive multilayer structure possessing at least one portion which lies on a top surface of the at least one lower interconnection level. Following producing of the capacitive multilayer structure, the at least one portion thereof is covered with an insulating protective layer. Then, at least one upper interconnection level of the integrated circuit is produced within which the at least one portion and insulating protective layer lie.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 1 to 9 illustrate schematically the main steps of a method of implementing a process for fabricating a three-dimensional capacitor according to the invention and of a planar capacitor according to the invention in FIGS. 5 to 9.

DETAILED DESCRIPTION OF THE PREFERRED EMBODIMENTS

Figure 1:
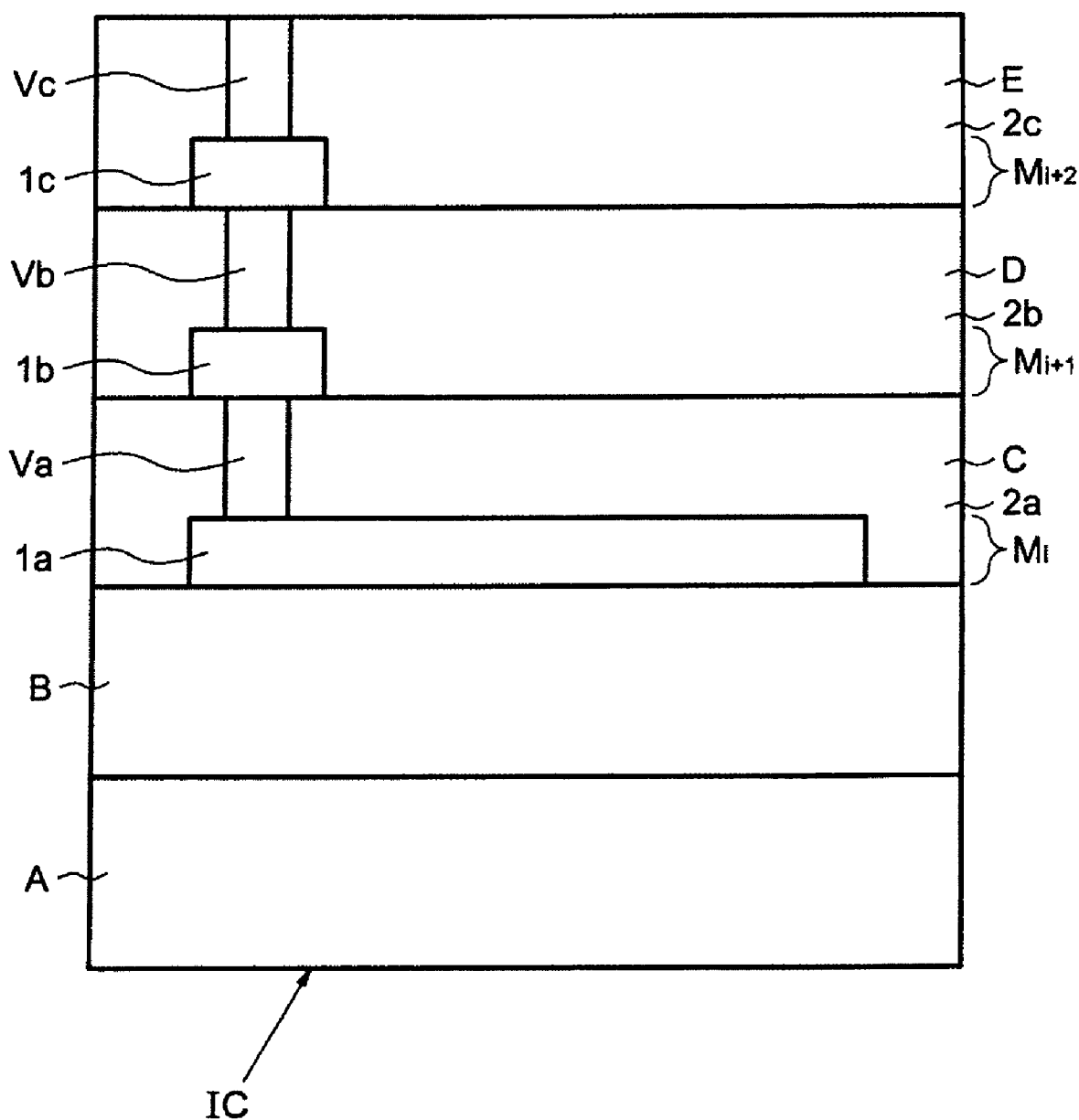

FIG. 1 shows an integrated circuit CI comprising a silicon substrate A on which a dielectric layer B has been deposited. Several interconnection levels C, D and E rest on the dielectric layer B. Each interconnection level comprises a metallization level formed from metal tracks and a via level, the combination of the two being embedded in a dielectric. The production of each interconnection level is conventional and known per se to those skilled in the art. In the example described here, the metallization level $M_i$ of the interconnection level C includes a metal layer 1a. The layer 1a may be made of aluminum or copper. The metallization level $M_{i+1}$ of the interconnection level D includes an interconnection line or track 1b. The metallization level $M_{i+2}$ of the interconnection level E includes an interconnection line or track 1c. The interconnection lines 1a, 1b, 1c of the various interconnection levels C, D, E are connected together by the vias Va, Vb, Vc made in the dielectrics 2a, 2b and 2c. The interconnection levels C, D and E may incorporate passive components.

Figure 2:
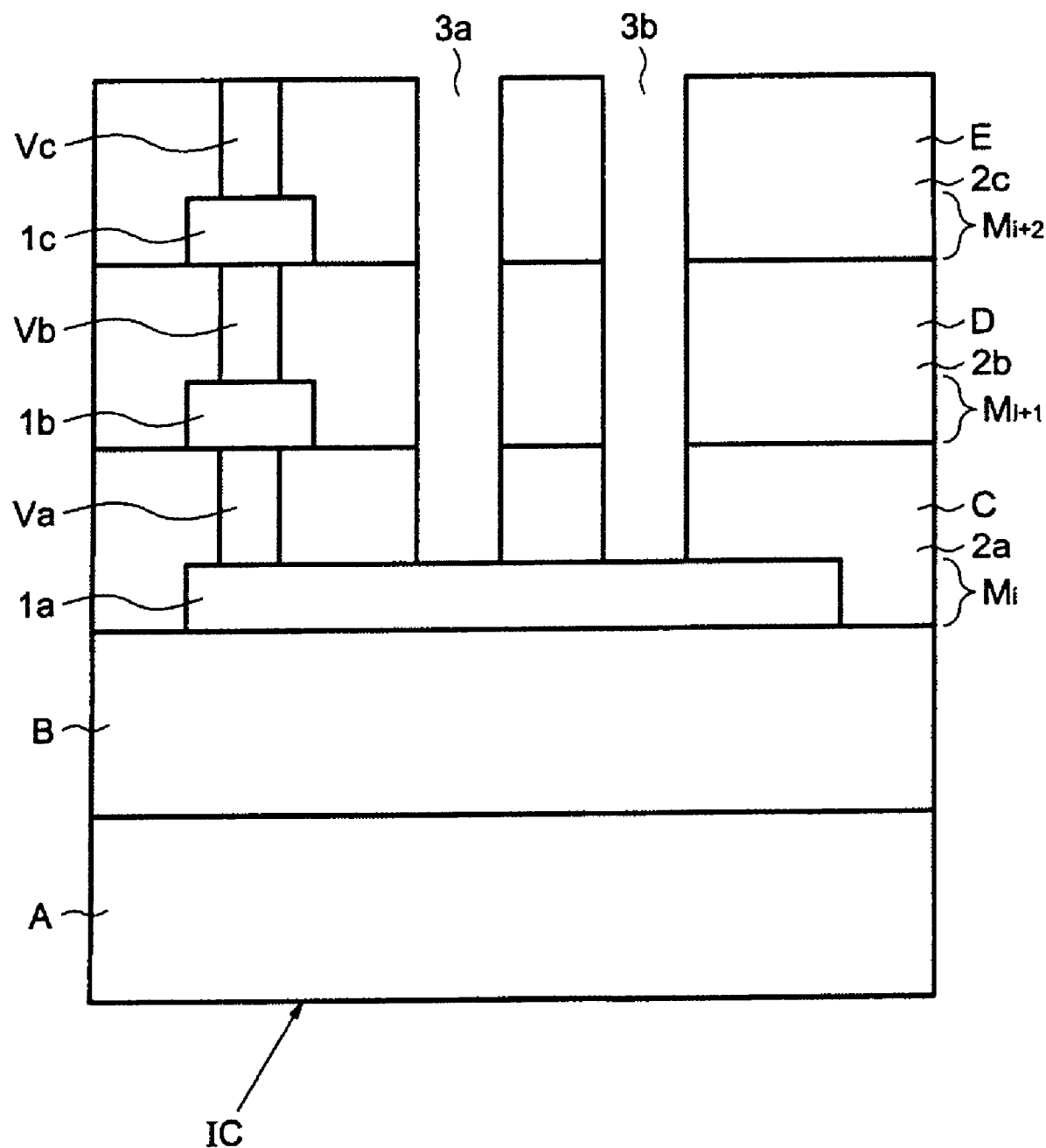

FIG. 2 illustrates the production of two trenches within the integrated circuit IC. The two trenches 3a and 3b are produced in a conventional manner known per se to those skilled in the art within the intermetallic dielectrics 2a, 2b and 2c of the levels C, D and E by photolithography followed by etching. The etching of these trenches stops on the metal layer 1a.

Figure 3:
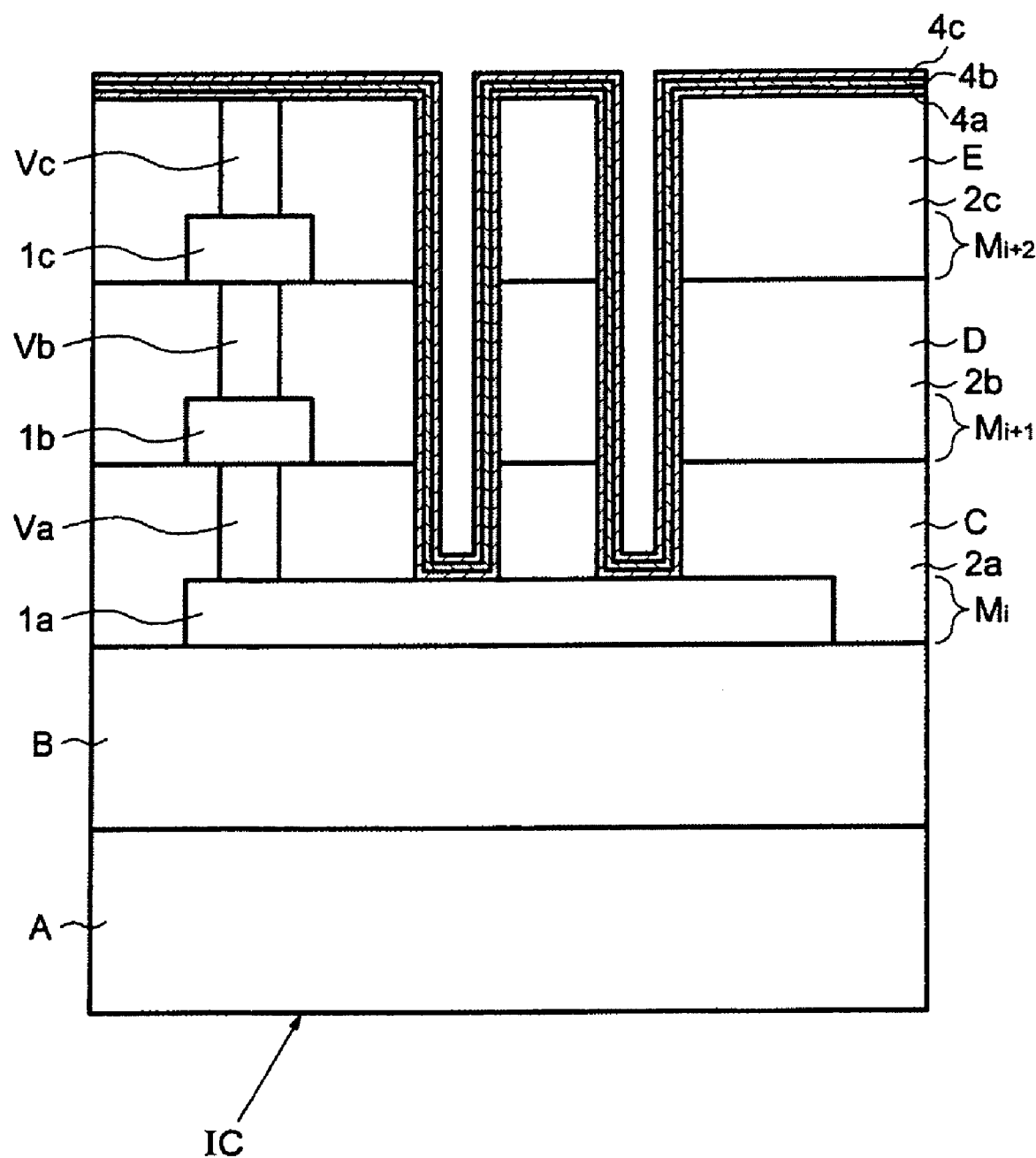

FIG. 3 illustrates the conventional formation, for example by deposition, of a capacitive feature formed from three successive layers, namely metal 4a, insulator 4b and metal 4c. The metal layers forming the electrodes may be made of TiN, TaN or W. The insulator layer may consist of $SiO_2$ or a dielectric such as $Al_2O_3$ or SiN or a dielectric having a high permittivity or high-k dielectric, such as $Ta_2O_5$ or $HfO_2$.

This capacitive multilayer is in particular deposited on the sidewalls of the trenches and in the bottom of the trenches, in such a way that the lower metal layer 4a comes into contact with the metal layer 1a. This metal layer 4a is intended to form the lower electrode of the capacitor.

Figure 4:
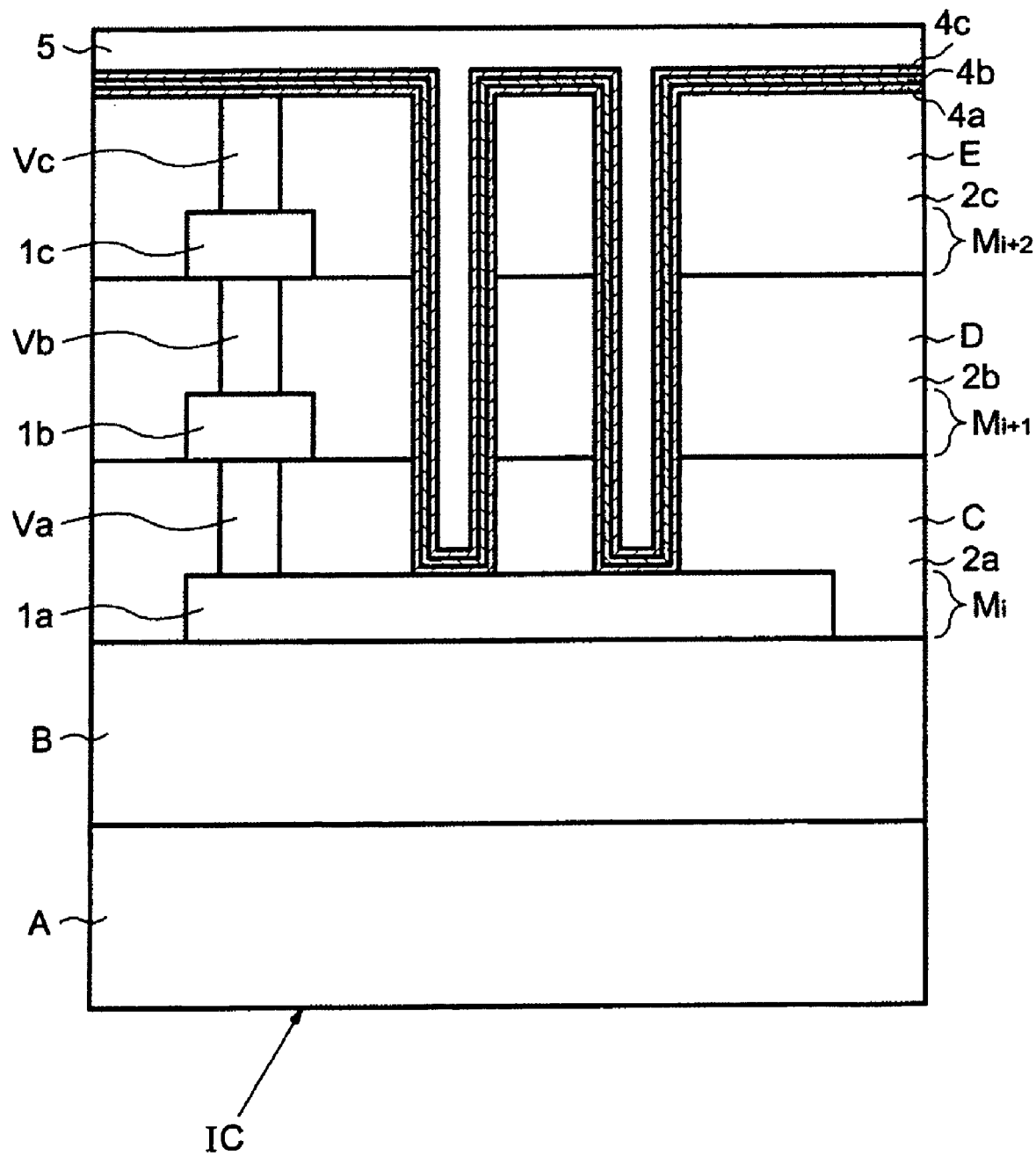

FIG. 4 illustrates the filling of the trenches with a conducting material 5 such as W, TiN or Al, for example by deposition.

FIG. 5 illustrates a three-dimensional capacitor 6 and a planar capacitor 7 on the same interconnection level, the lower interconnection levels not being shown. This figure illustrates the capacitors after the upper metal layers 5 and 4c have been etched so as to form the upper electrode of said capacitors 6 and 7.

FIG. 6 illustrates the three-dimensional capacitor 6 and the planar capacitor 7, on which an insulating protective layer 8 has been deposited by PECVD (plasma-enhanced chemical vapor deposition), for example at a temperature of 400° C. and a pressure of a few torr (typically 3 to 7 torr) for a time ranging from a few seconds to 60 seconds. Preferably, the insulating protective layer consists of silicon oxide or silicon nitride. The thickness h1 of the insulating protective layer is preferably at least 1000 Å.

Figure 7:
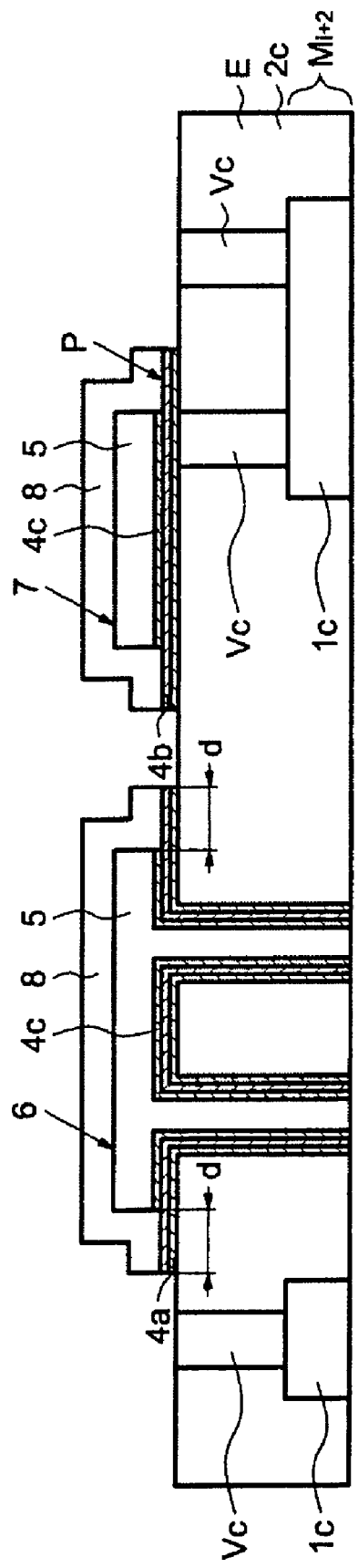

FIG. 7 illustrates the three-dimensional capacitor 6 and the planar capacitor 7 after the protective layer 8, the dielectric 4b and the lower electrode 4a have been simultaneously etched. This etching is carried out so as to slightly offset the dielectric 4b and the subjacent lower electrode 4a with respect to the metal layers 4c and 5 that form the upper electrode, constituting the offset part P. Thus, any lateral short-circuiting between the lower electrode and the upper electrode of the capacitor during etching is prevented. The distance d between the end of the upper electrodes 4c and 5 and the end of the dielectric 4b/lower electrode 4a multilayer is preferably between 0.3 and 2 µm, typically 1 µm. This distance is controlled by the conventional photoetching process.

Figure 8:
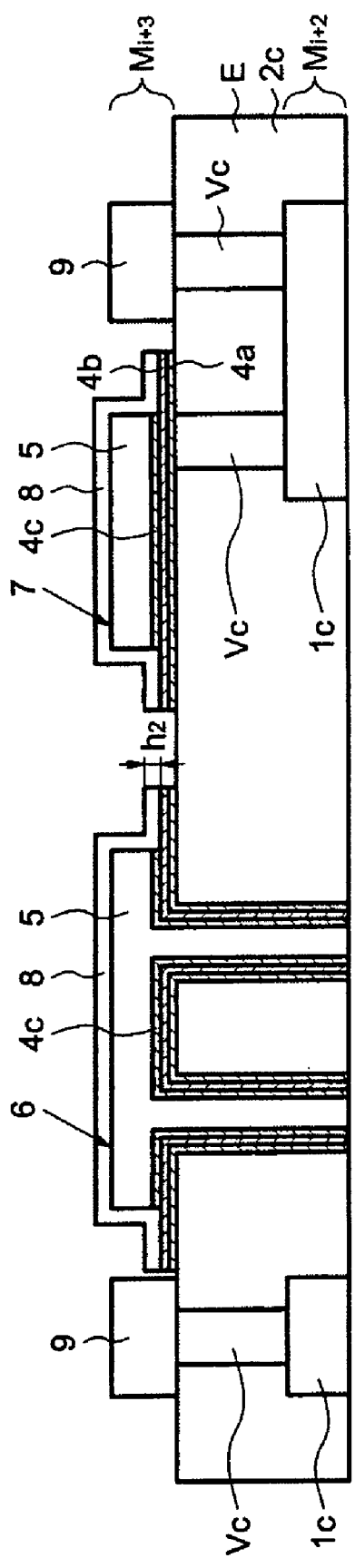

Next, the metallization level $M_{i+3}$ (FIG. 8) is conventionally produced, in particular to form the tracks 9 in contact with the vias Vc. While the metal is being etched, the protective layer is partially eroded, its thickness $h_2$ becoming less than the initial thickness h.

Figure 9:
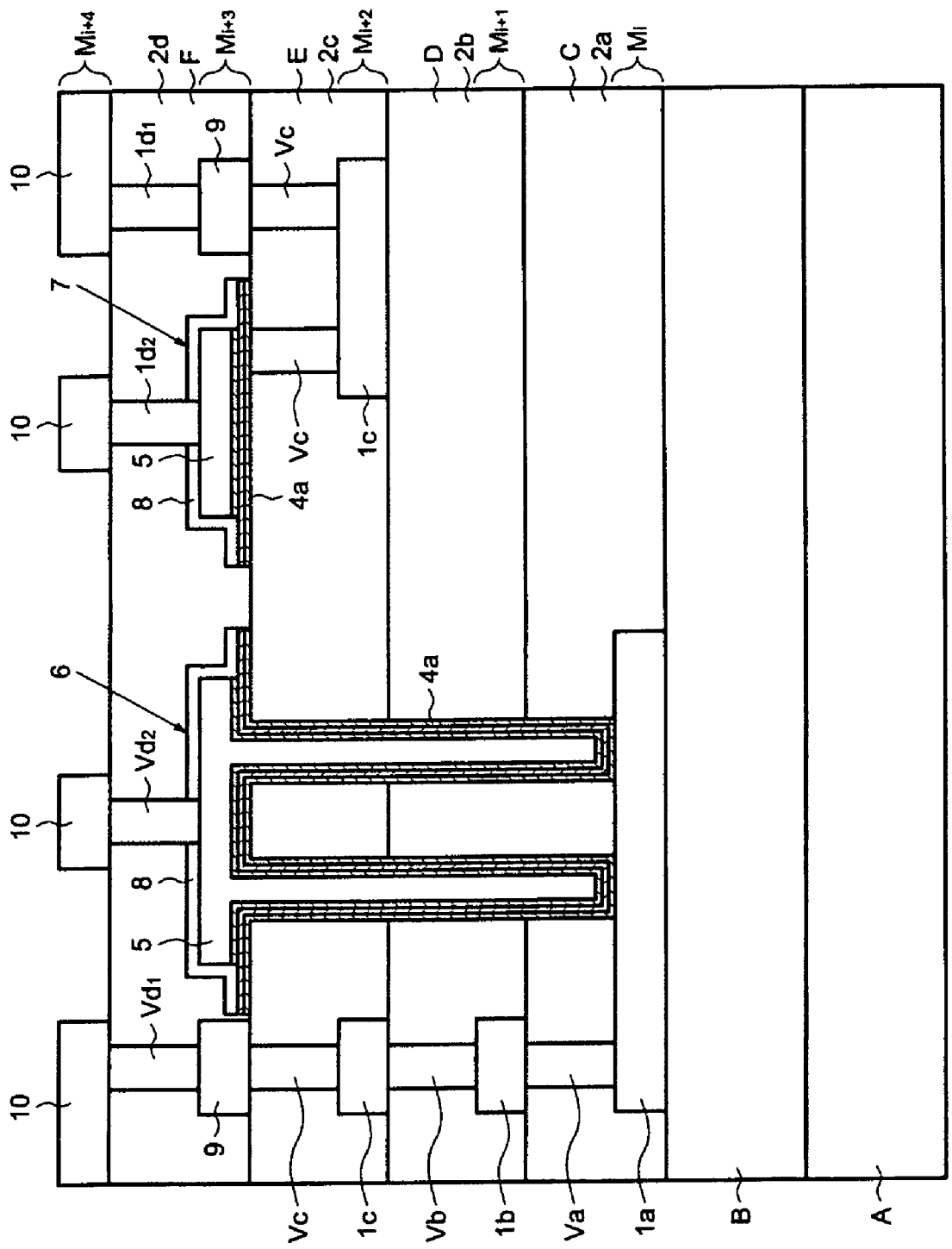

FIG. 9 illustrates the end of the process for producing the interconnection level F by deposition of a dielectric 2d. A via $Vd_1$ lying along the extension of the vias Vc, Vb and Va and of the interconnection lines 1a, 1b, 1c and 9 is produced. A second via $Vd_2$ is produced so as to come into contact with the metal layer 5 of the upper electrode of the three-dimensional capacitor 6 by etching the dielectric 2d and the protective layer 8.

Another via $1d_1$ lying along the extension of the via Vc and of the interconnection lines 1c and 9 is produced. A final via $1d_2$ is produced so as to come into contact with the metal layer 5 of the upper electrode of the planar capacitor 7 by etching the dielectric 2d and the protective layer 8. Interconnection lines 10 are then produced in the metal level $M_{i+4}$ on the vias $Vd_1$, $Vd_2$, $1d_1$ and $1d_2$.

In the case of the three-dimensional capacitor, the lower electrode 4a is contacted via the tracks 10, 9, 1c and 1b, the vias $Vd_1$, Vc, Vb and Va and the metal layer 1a. The upper electrode 5 is contacted via the track 10 and the via $Vd_2$.

The metal layer 1a contacting the bottom of the trenches serves both as a stop layer for etching the trenches 3a and 3b and serves to partly short-circuit the lower electrode 4a of the three-dimensional capacitor 6. Thus, the height of the trenches is controlled from one batch to another, and the access resistance of the capacitor is reduced.

The embodiment of the three-dimensional capacitor illustrated in FIG. 9 is in no way limiting. The contacting of the lower electrode 4a may take place directly on the latter and not by means of the metal layer 1a. The three-dimensional capacitors implemented according to the invention may comprise one or more capacitive trenches, and are not limited to two trenches as illustrated.

The embodiment of the planar capacitor illustrated in FIG. 9 is in no way limiting. The contacting of the lower electrode 4a may take place directly on the latter and not from below by means of the track 1c.

The insulating protective layer 8 makes it possible to absorb the overetching of the interconnection lines. The good resistance of silicon oxide and silicon nitride to the metal etching process prevents the dielectric 4b, the subjacent lower electrode 4a and the metal layer 5 from being etched. The thickness of the dielectric layer 4b and the thickness of the metal layer forming the subjacent lower electrode 4a and the thickness of the metal layer 5 are maintained. In addition, the electrodes can no longer be contacted by metal residues. Finally, the insulating protective layer makes it possible to eliminate any defective behavior at the edge of capacitors, such as leakage currents or premature breakdowns.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for producing an integrated circuit, comprising:
   producing at least one lower interconnection level of the integrated circuit;
   producing a capacitive multilayer structure possessing a metal-insulator-metal portion which lies on a top surface of the at least one lower interconnection level and having another metal-insulator-metal portion formed in at least one capacitive trench lying within the lower interconnection level;
   removing a portion of an upper metal layer in the metal-insulator-metal portion to provide a metal-insulator-metal part and a laterally adjacent insulator-metal part;
   following removing, covering the metal-insulator-metal part and laterally adjacent insulator-metal part with an insulating protective layer;
   removing a part of the insulating protective layer and a vertically adjacent part of the insulator-metal portion; and
   then producing at least one upper interconnection level of the integrated circuit within which the metal-insulator-metal portion and insulating protective layer lie.

2. The process of claim 1 wherein the capacitive multilayer structure comprises the upper metal layer, a lower metal layer and an insulator layer therebetween, the step of removing comprising etching the upper metal layer to be offset from the lower metal layer.

3. The process of claim 1 wherein the capacitive multilayer structure forms a three-dimensional capacitor, the process further comprising forming at least one trench in the at least one lower interconnection level and wherein producing the capacitive multilayer structure comprises filling the at least one trench with the capacitive multilayer structure.

4. The process of claim 3 further comprising burying an embedded metal layer beneath the at least one lower interconnection level and wherein forming the at least one trench comprises etching the trench until stopped by the embedded metal layer, and wherein producing the capacitive multilayer structure comprises filling the at least one trench with the capacitive multilayer structure such that the lower metal layer of the capacitive multilayer structure is in electrical contact with the embedded metal layer.

5. The method of claim 1 wherein the step of producing at least one upper interconnection level of the integrated circuit further comprises etching a metal interconnect layer, the insulating protective layer protecting the the capacitive multilayer structure from being damaged during that etching.

6. A process for producing an integrated circuit, comprising:
   producing at least one lower interconnection level of the integrated circuit including at least one trench;
   then producing a capacitive multilayer structure having an upper metal layer, a lower metal layer and an insulator layer therebetween, wherein at least one portion of the capacitive multilayer structure lies on a top surface of, and fills the at least one trench of, the at least one lower interconnection level;
   then etching a portion of the upper metal layer of the capacitive multilayer structure away in the area of the at least one portion to reveal a top surface of the insulator layer and be horizontally offset from the lower metal layer;
   then depositing an insulating protective layer to cover the revealed insulator layer and remaining portions of the upper metal layer;
   then etching to remove a portion of the insulating protective layer, a portion of the revealed insulator layer lying vertically thereunder and a portion of the lower metal layer lying vertically thereunder; and
   then producing at least one upper interconnection level of the integrated circuit within which lie both the at least one portion of the capacitive multilayer structure and the insulating protective layer.

7. The process of claim 6 wherein the capacitive multilayer structure forms a three-dimensional capacitor.

8. The process of claim 6 further comprising, before producing the capacitive multilayer structure, forming the at least one trench in the at least one lower interconnection level.

9. The process of claim 6 further comprising, before producing the capacitive multilayer structure:
   burying an embedded metal layer beneath the at least one lower interconnection level; and
   forming at least one trench in the at least one lower interconnection level which extend to the embedded metal layer; and
   wherein producing the capacitive multilayer structure comprises filling a portion of the at least one trench with the capacitive multilayer structure such that the lower metal layer of the capacitive multilayer structure is in electrical contact with the embedded metal layer.

10. The process of claim 9 wherein forming at least one trench comprises etching the at least one lower interconnection level to the embedded metal layer.

* * * * *